(12) United States Patent
Kao

(10) Patent No.: US 6,927,981 B1
(45) Date of Patent: Aug. 9, 2005

(54) CPU CLAMP (1)

(75) Inventor: Li-Hui Kao, Taipei Shien (TW)

(73) Assignee: Horng Tong Enterprise Co., LTD, Taipei Hsien (TW)

( * ) Notice: Subject to any disclaimer, the term of this patent is extended or adjusted under 35 U.S.C. 154(b) by 0 days.

(21) Appl. No.: 10/950,236

(22) Filed: Sep. 24, 2004

(51) Int. Cl.[7] .......................... H05K 1/12; H01R 13/40; H01L 23/02
(52) U.S. Cl. .................. 361/740; 361/747; 439/73; 439/331; 257/727
(58) Field of Search ............................. 361/683, 684, 361/726, 732, 740, 747, 759, 801; 439/66, 439/68, 73, 330, 331; 257/704, 707, 727, 257/731

(56) References Cited

U.S. PATENT DOCUMENTS

| | | | | |
|---|---|---|---|---|
| 4,601,525 A | * | 7/1986 | Kandybowski | 439/329 |
| 5,344,334 A | * | 9/1994 | Laub et al. | 439/331 |
| 5,793,618 A | * | 8/1998 | Chan et al. | 361/809 |
| 6,648,656 B1 | * | 11/2003 | Ma | 439/73 |
| 6,676,429 B1 | * | 1/2004 | McHugh et al. | 439/331 |
| 6,692,279 B1 | * | 2/2004 | Ma | 439/331 |
| 6,716,050 B1 | * | 4/2004 | Ma et al. | 439/331 |
| 6,722,909 B1 | * | 4/2004 | McHugh et al. | 439/331 |
| 6,726,500 B1 | * | 4/2004 | McHugh et al. | 439/331 |
| 6,776,625 B2 | * | 8/2004 | Ma | 439/73 |
| 6,780,024 B2 | * | 8/2004 | Ma | 439/73 |
| 6,780,025 B2 | * | 8/2004 | Ma et al. | 439/73 |
| 6,799,978 B2 | * | 10/2004 | Ma et al. | 439/73 |
| 6,805,562 B2 | * | 10/2004 | Liao et al. | 439/68 |
| 6,827,587 B2 | * | 12/2004 | Ma | 439/73 |
| 6,832,919 B2 | * | 12/2004 | Ma et al. | 439/73 |

* cited by examiner

*Primary Examiner*—Kamand Cuneo
*Assistant Examiner*—Dameon E. Levi
(74) *Attorney, Agent, or Firm*—Pro-Techtor International Services

(57) ABSTRACT

The present invention is a CPU clamp (1) including an upper clamp, a lower clamp, and a framework that, by utilizing an elastic body and hooks, a CPU can be easily and swiftly taken out of and placed on a mount and also be protected in a protector formed by the framework and the lower clamp, thereby enabling the CPU being prevented from hitting out of a careless operation and being carried or shipped without causing damage.

8 Claims, 7 Drawing Sheets

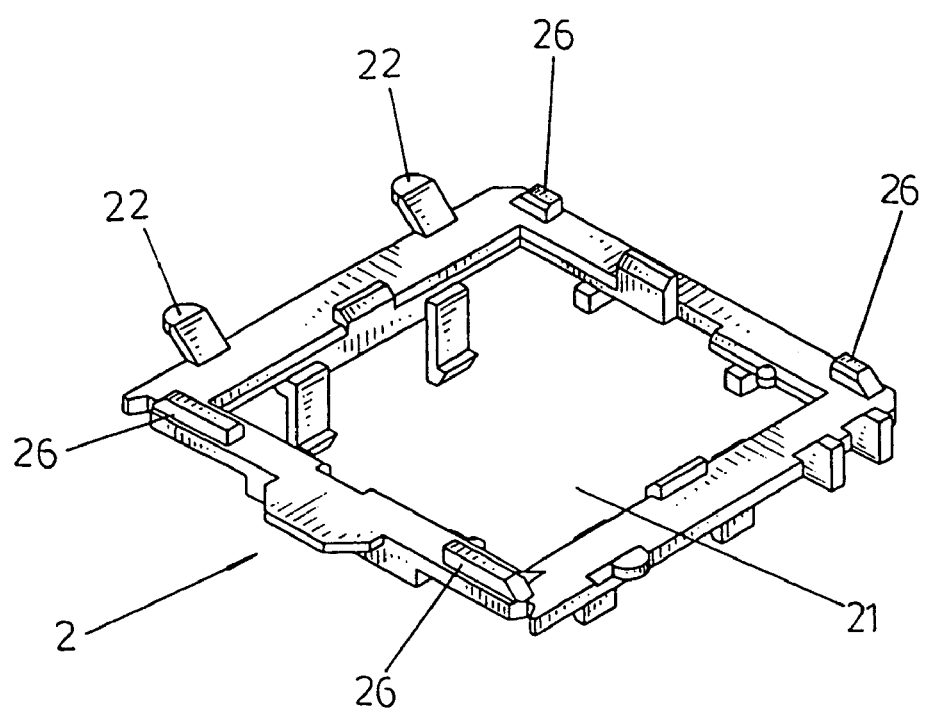
FIG.4~1

CPU CLAMP (1)

BACKGROUND OF THE INVENTION (a) Field of the Invention

The present invention relates to a CPU clamp (1) that a CPU can be easily and swiftly taken out of or placed on a mount and also be protected in a protector formed by a framework and a lower clamp, thereby enabling the CPU being prevented from hitting out of a careless operation and being carried or shipped without causing damage.

(b) Description of the Prior Art

Referring to FIG. 1. A CPU 100 is loaded on a handling cell 300 before final application. Referring to FIG. 2. A CPU 100 is placed on a mount 200 having a base plate 201 and connection pins 202, wherein the circuit on the bottom of the CPU 100 connects connection pins 202. To relocate the CPU 100, a conventional way is to use a bare hand to take the CPU 100 out of the handling cell 300 and then place it on the mount 200, which may affect the connection pins 202 functioning due to hand sweat or static electricity, besides a risk that the CPU 100 can be dropped, out of a careless operation, that may damage connection pins.

SUMMARY OF THE INVENTION

The present invention relates to a CPU clamp (1) including a combination of an upper clamp and a lower clamp that, by utilizing a spring force of an elastic body of the upper clamp, a CPU can be easily and swiftly taken out of or placed on a mount and also be protected in a protector formed by a framework and a lower clamp, thereby enabling the CPU being prevented from hitting out of a careless operation and being carried or shipped without causing damage.

To enable a further understanding of the said objectives and the technological methods of the invention herein, the brief description of the drawings below is followed by the detailed description of the preferred embodiments.

BRIEF DESCRIPTION OF THE DRAWING

FIG. 4-1 shows a perspective view of the lower clamp by the present invention.

DETAILED DESCRIPTION OF THE PREFERRED EMBODIMENTS

Figure 1:
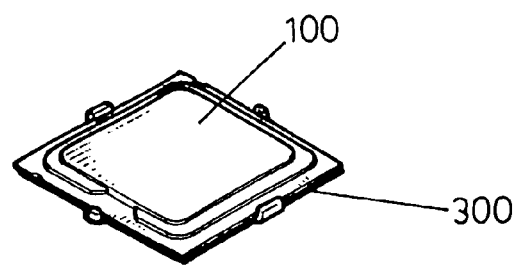
FIG. 1 shows a perspective view of a CPU on a handling cell.
Figure 2:
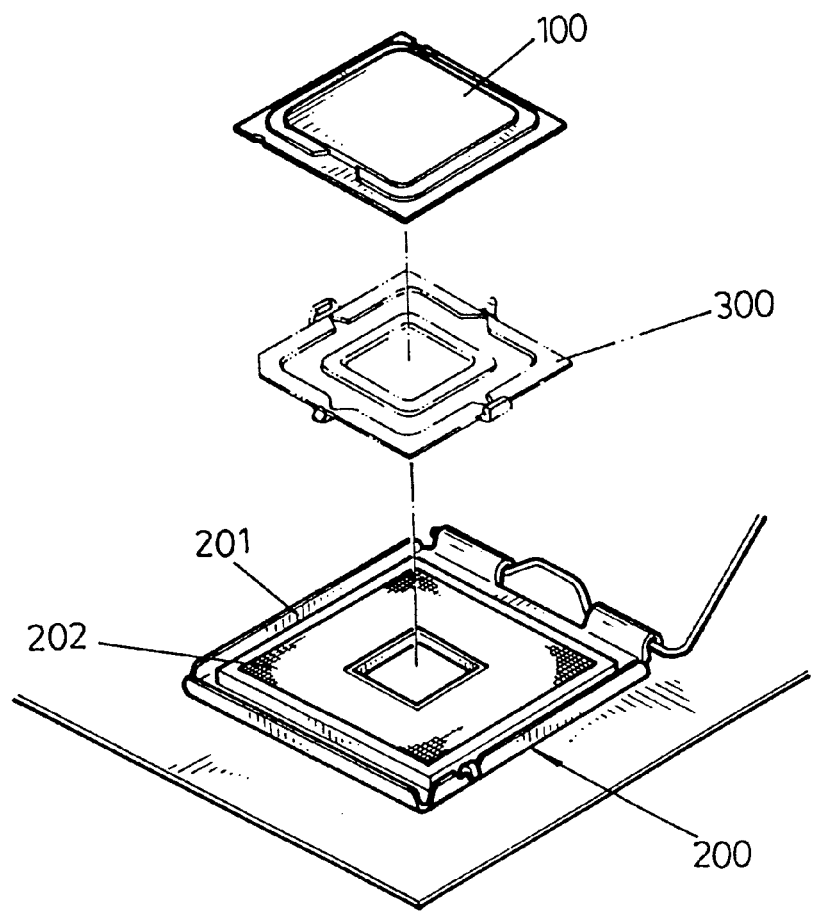
FIG. 2 shows an exploded elevational view of a CPU on a mount.
Figure 3:
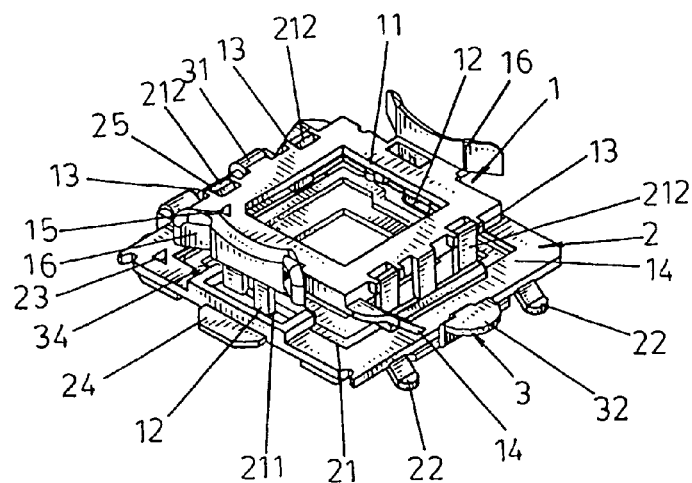
FIG. 3 shows a perspective view of the present invention.
Figure 4:
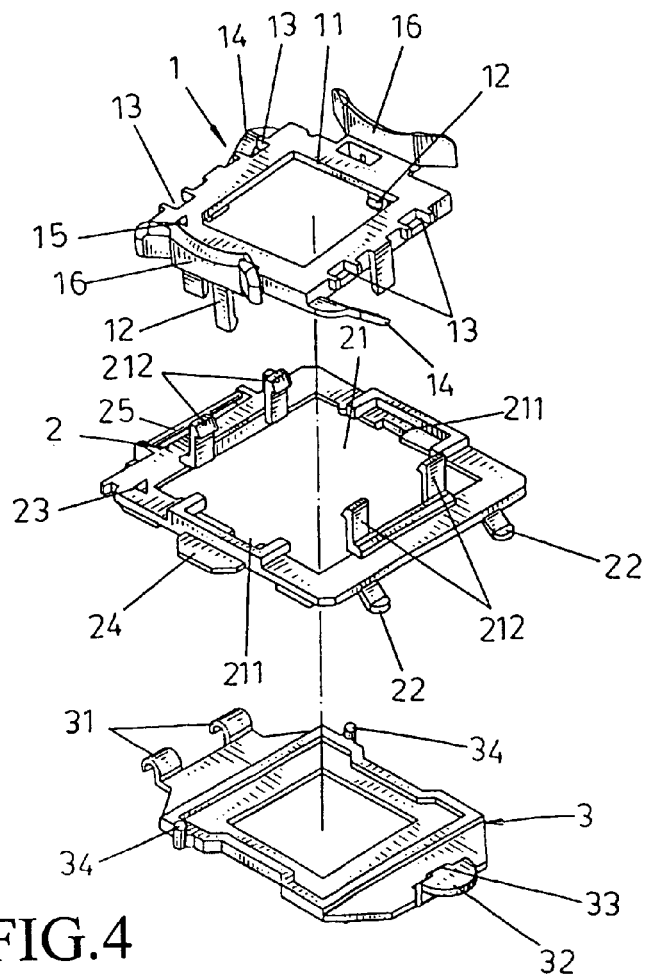
FIG. 4 shows an exploded elevational view of the present invention.
Figure 5:
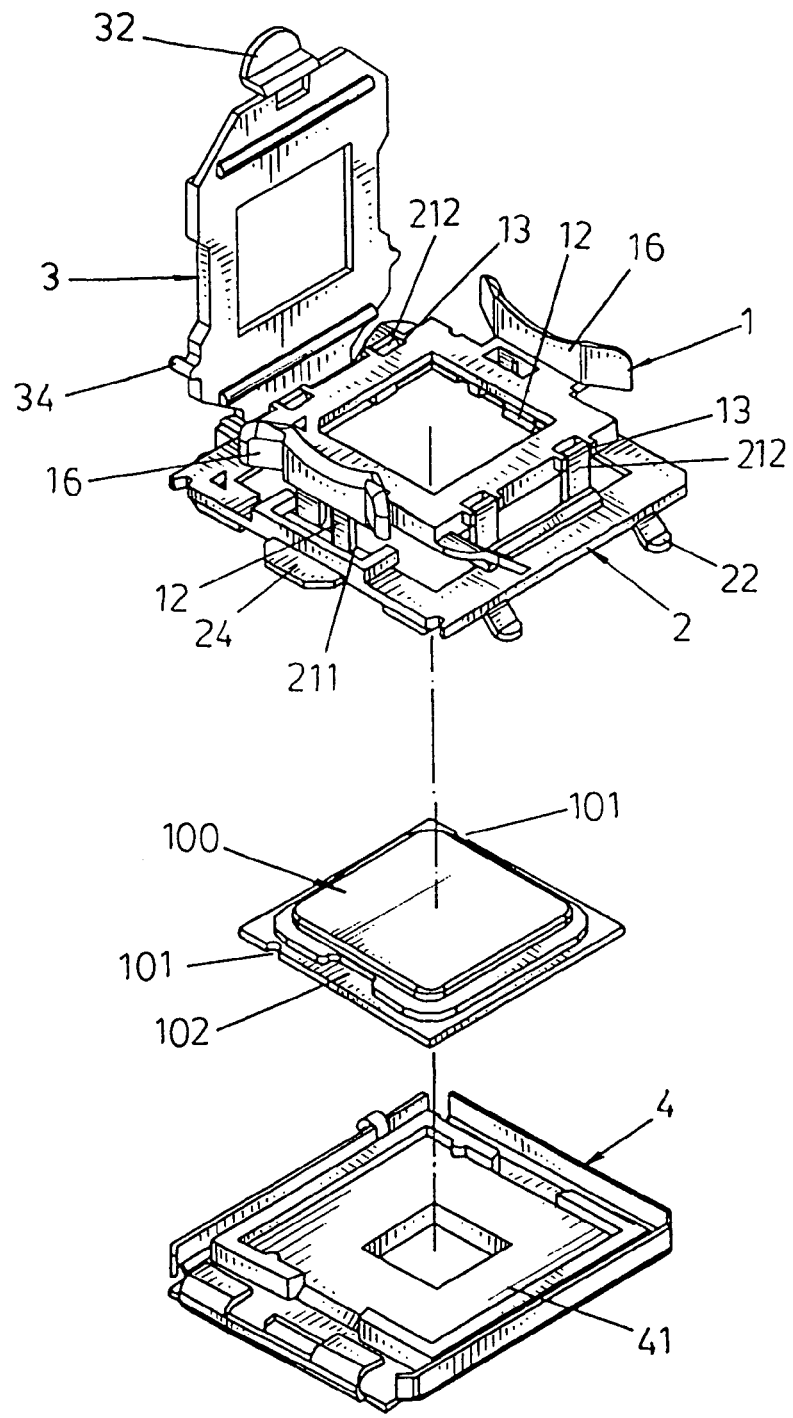
FIG. 5 shows an exploded elevational view of a CPU before being clamped by the present invention for placing on a mount.

Referring to FIGS. 3 to 5. The present invention is a CPU clamp (1) having an upper clamp 1, a lower clamp 2, and a framework 3 that the CPU 100 can be loaded on or removed from a mount 4, wherein the lower clamp 2, being in a form of a rectangular frame with a hollow 21, having a groove 211 formed on each opposite side of an inner perimeter, a hook 212 formed on each of the other opposite sides thereof, at least a pad 22 formed on each end of each side of an outer perimeter thereof, a mark 23 formed at an corner, a handle 24 formed on a side, a shaft 25 formed on a side to hinge the framework 3, and a positioning block 26 formed near each corner thereof for fitting the CPU 100;

the upper clamp 1, being in a form of a rectangular frame with a hollow 11, having a vertical hook 12 and an arc block 16 formed on each opposite side of an outer perimeter, two gaps 13 and a elastic body 14 formed on each of the other opposite sides thereof, and a mark 15 corresponding to the mark 23 formed at an corner, wherein, the vertical hook 12 extending downward and reaching the groove 211, the arc block 16 being used for taking up the upper clamp 1, each gap 13 being able to be hooked by the hook 212, and each elastic body 14 being able to be pressed downwards to touch against a surface of the lower clamp 2;

the framework 3, having two hinge structures 31 formed on a side for hinging the shaft 25 of the lower clamp 2, a semicircle releasing block 32 formed on the opposite side, with a locking projection 33 formed on the diameter side for locking the lower clamp 2, and two positioning poles 34 formed the other two sides for fitting positioning grooves 101 of the CPU 100.

Figure 6:
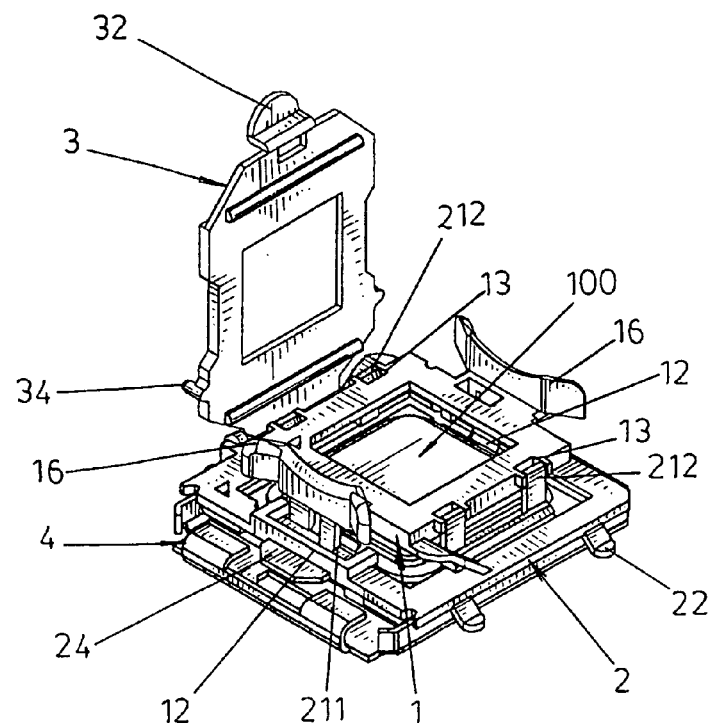
FIG. 6 shows a perspective view of a CPU being clamped by the present invention and being placed on the mount.
Figure 7:
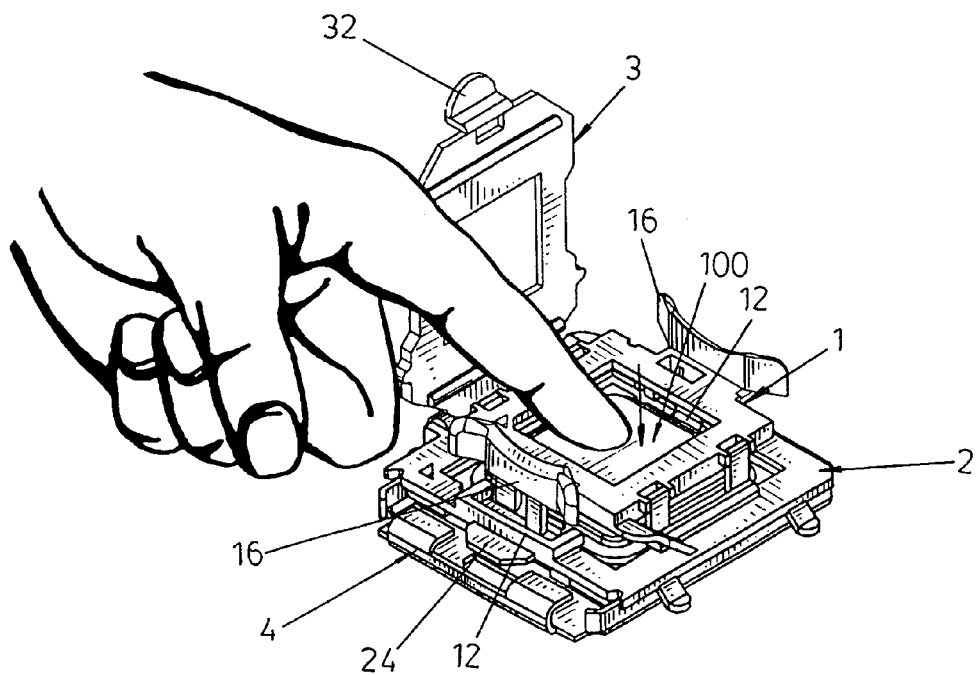
FIG. 7 shows a view of how to detach a CPU from being clamped by the present invention in order to load on a mount.
Figure 8:
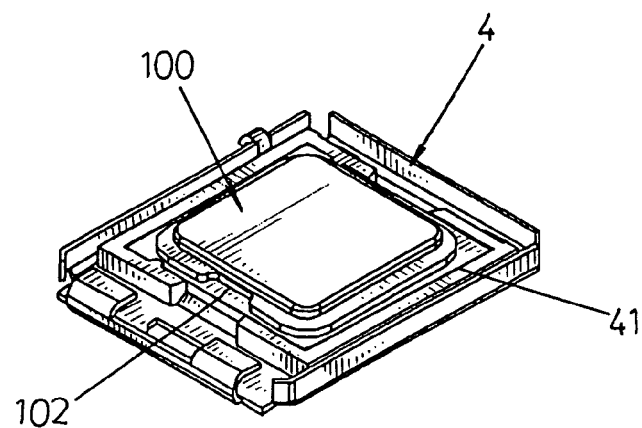
FIG. 8 shows a perspective view of a CPU loaded on a mount.

Referring to FIG. 5. Upon the framework 3 being turned upward and by pressing the upper clamp 1, the vertical hook 12 of the upper clamp 1 thereby clamps each panel 102 of the CPU 100 for removing the CPU 100. Referring to FIG. 6. The clamped CPU 100 is temporarily loaded on the mount 4. Referring to FIGS. 7 and 8. By pressing the CPU 100 from the hollow 11 with a finger, the CPU 100 thereby being loaded on a base plate 41 of the mount 4.

Figure 9:
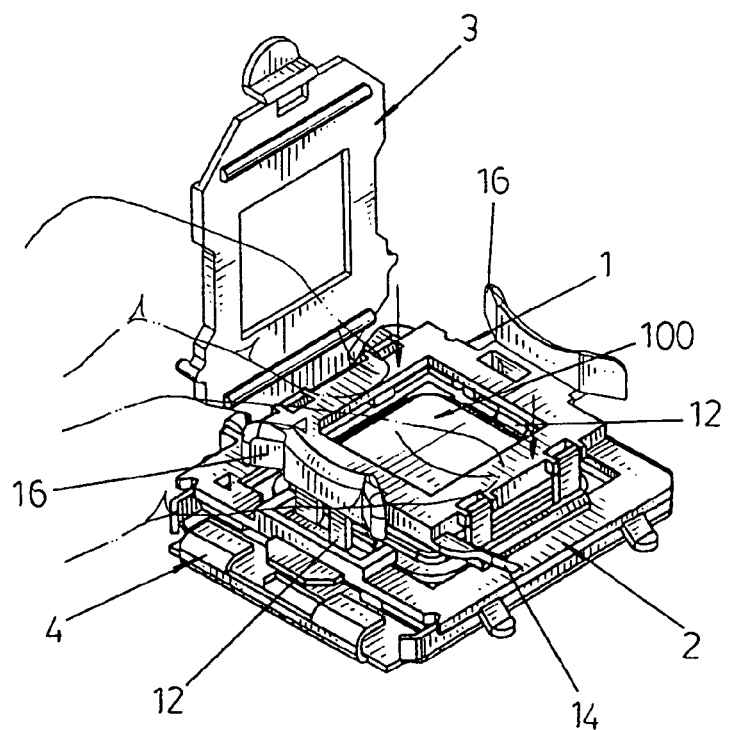
FIG. 9 shows a view of how to remove a CPU, being clamped by the present invention, from a mount.

Referring to FIG. 9. After capping the CPU clamp (1) on the CPU 100, imposing a force upon the upper clamp 1 to force elastic bodies 14 moving downward such that each vertical hook 12 extending downward to clamp the panel 102 of the CPU 100, thereby, when releasing the force imposed thereon before, elastic bodies will be moving upward, enabling the CPU 100 being taken out by an upward movement of the upper clamp 1.

Figure 10:
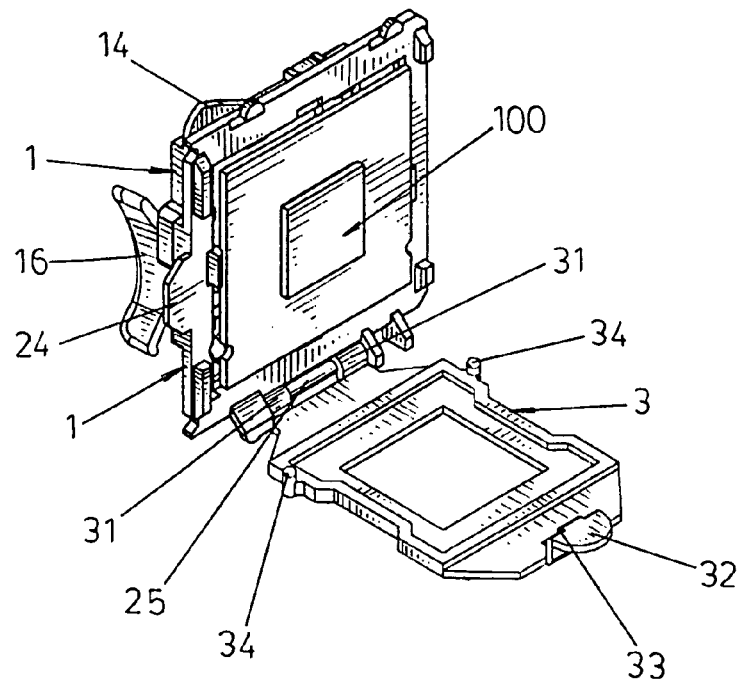
FIG. 10 shows a perspective view of a CPU being clamped by the present invention.
Figure 11:
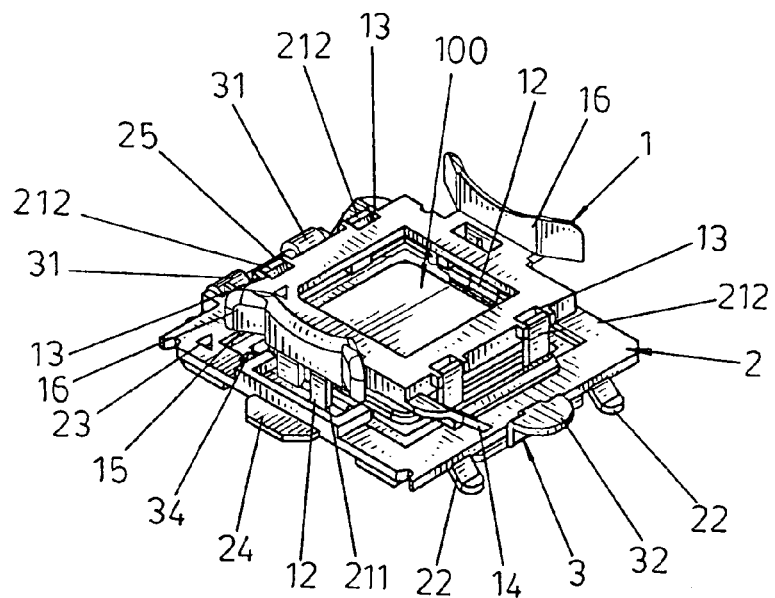
FIG. 11 shows a perspective assembled view of a CPU being clamped by the present invention.

Referring to FIGS. 10 and 11. After clamping CPU 100 and with the locking projection 33 of the framework 3 securing to the lower clamp 2, a CPU 100 protector thereby formed to facilitate the CPU 100 being carried or shipped. To unloaded the CPU 100, press down the releasing block 32 to turn the framework 3 upward, then process in accordance with FIGS. 5 to 8.

In summary, the present invention related to a CPU clamp (1) having the upper clamp, the lower clamp, and the framework that a CPU can be easily clamped to take out of or place on a mount and also be protected in a protector formed by the framework and the lower clamp, thereby enabling the CPU being prevented from hitting out of a careless operation and being carried or shipped without causing damage.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. A CPU clamp (1) comprising an upper clamp, a lower clamp and a framework for the CPU being loaded on or removed from a mount, wherein the lower clamp, having a groove formed on each opposite side of an inner perimeter of a hollow, a hook formed on each side adjoining thereof, and a shaft formed on a side to hinge the framework;

the upper clamp, having a hollow and comprising a vertical hook formed on each opposite side of an outer perimeter, two gaps and an elastic body formed on each of the other opposite sides thereof, wherein, the vertical hook extending downward and reaching the groove of the lower clamp, each gap being able to be hooked by the hook of the lower clamp, and each elastic body being able to be forced downwards to touch against a surface of the lower clamp;

the framework, being hinged on a shaft on a side of the lower clamp and having a releasing block formed on the opposite side, wherein a locking projection formed on the diameter side locking the lower clamp, a CPU protector thereby formed by the framework and the lower clamp to facilitate the CPU being carried or shipped.

2. The CPU clamp (1) as recited in claim 1, wherein two positioning poles formed for fitting positioning grooves of the CPU.

3. The CPU clamp (1) as recited in claim 1, wherein the framework being hinged with two hinge structures formed on a side of the lower clamp.

4. The CPU clamp (1) as recited in claim 1, wherein a mark formed on each upper and lower clamp.

5. The CPU clamp (1) as recited in claim 1, wherein pads formed on each side end of an outer perimeter of the lower clamp.

6. The CPU clamp (1) as recited in claim 1, wherein a handle formed on a side of the outer perimeter of the lower clamp.

7. The CPU clamp (1) as recited in claim 1, wherein a positioning block formed near each corner for fitting the CPU.

8. The CPU clamp (1) as recited in claim 1, wherein an arc block formed on the upper of each opposite side of an outer perimeter of the upper clamp.

* * * * *